(12) United States Patent
Swanson et al.

(10) Patent No.: US 6,833,300 B2
(45) Date of Patent: Dec. 21, 2004

(54) METHOD OF FORMING INTEGRATED CIRCUIT CONTACTS

(75) Inventors: Leland S. Swanson, McKinney, TX (US); Gregory E. Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/350,691

(22) Filed: Jan. 24, 2003

(65) Prior Publication Data

US 2004/0147110 A1 Jul. 29, 2004

(51) Int. Cl.⁷ .......................................... H01L 21/8234
(52) U.S. Cl. ..................... 438/238; 438/256; 438/381; 438/396; 438/399; 438/623; 438/624; 438/634; 438/637; 438/666
(58) Field of Search ................................. 438/238, 256, 438/381, 396, 399, 623–624, 634, 637, 666

(56) References Cited

U.S. PATENT DOCUMENTS 6,261,892 B1 * 7/2001 Swanson ..................... 438/238
6,596,581 B2 * 7/2003 Park et al. .................. 438/253
2003/0027385 A1 * 2/2003 Park et al. .................. 438/253

* cited by examiner

*Primary Examiner*—Lynne A. Gurley
(74) *Attorney, Agent, or Firm*—Peter K. McLarty; W. James Brady, III; Frederick J. Telecky, Jr.

(57) ABSTRACT

Contacts are formed to integrated circuit devices by first forming a conductive layer (80) on a semiconductor device. An optional dielectric layer (130) is formed over the conductive layer and a carbon containing dielectric layer (140) is formed over the optional dielectric layer (130). Contacts are formed to the conductive layer (80) by etching openings in the carbon containing dielectric layer (140) and the optional dielectric layer (130).

3 Claims, 6 Drawing Sheets

METHOD OF FORMING INTEGRATED CIRCUIT CONTACTS

FIELD OF THE INVENTION

This invention relates generally to the field of integrated circuit manufacturing and more particularly to a method for forming contacts to electronic devices.

BACKGROUND OF THE INVENTION

Integrated circuits comprise electronic devices such as transistors, resistors, and capacitors formed on a semiconductor substrate. The individual electronic devices are interconnected using a number of layers of metal interconnects formed in alternating dielectric layers above the surface of the semiconductor substrate containing the devices. Each electronic device that comprises the integrated circuit has to be connected to the metal lines through the dielectric layers that overlie the semiconductor substrate surface. Typically a pre-metal dielectric (PMD) layer is formed over the semiconductor substrate following the formation of the electronic devices in the semiconductor substrate. Electrical contact is made to the underlying electronic devices by forming openings in the PMD layer and filling the openings with a conductive plug formed using a conductive material such as titanium nitride, tungsten, or aluminum. The conductive plug (or plug) formed in the openings will allow an electrical connection to be made from the electronic devices to the various metal layers formed above the PMD layer. An example of such an electrical connection made to a typical metal oxide semiconductor (MOS) transistor is shown in FIG. 1.

Figure 1:
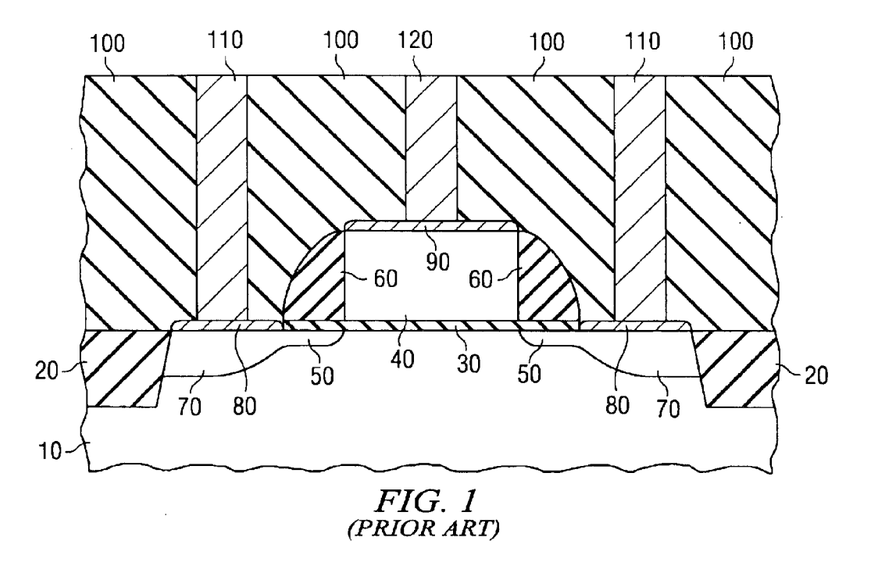
FIG. 1 is a cross-sectional diagram showing a MOS transistor according to the prior art.

Shown in FIG. 1 is a typical MOS transistor fabricated using standard integrated circuit processing methodology. Isolation regions 20 are formed in a semiconductor 10. A transistor gate stack comprising a gate dielectric layer 30 and a gate electrode 40 is formed on the surface of the semiconductor 10. The gate electrode usually comprises a conductive material such as doped polycrystalline silicon and various metals and silicides. Typical thicknesses for the transistor gate stack are between 800A and 5000A. Following the formation of the transistor gate stack a number of self-aligned implants are performed. These self-aligned implants include drain/source extension implant and pocket implants. The self-aligned implants that are aligned to the transistor gate stack will result in the formation of the doped regions 50 in the semiconductor 10. Sidewall structures 60 are formed adjacent to the gate electrode 40 using standard processing technology. The sidewall structures 60 typically comprise dielectric material such as silicon oxide, silicon nitride, or any other suitable dielectric material. Following the formation of the sidewall structures 60, the transistor source and drain regions 70 are formed by implanting suitable dopants into the semiconductor 10. Following the formation of the source and drain regions 70, metal silicide layers 80 and 90 and formed on the source and drain regions 70 and the gate electrode 40 respectively. The metal silicide layers 80 and 90 will reduce the contact resistance between the MOS transistor and the metal layers. A PMD layer 100 is formed over the MOS transistor as shown in Figure and openings are 110 and 120 are formed in the PMD layer. Conductive plugs will be formed in the openings and the openings are formed using standard integrated circuit processing techniques.

Typically the openings 110 and 120 are formed by first forming patterned photoresist on the PMD layer. The patterned photoresist will then act as a mask during the subsequent contact etching process used to form the openings. It should be noted that the silicide layer 90 formed on the gate electrode 40 is about 800A to 5000A above the silicide layer 80 formed on the source drain regions. This topographic variation makes performing the contact etch down to the various silicide layers difficult. The different height of the various silicide layers 80 and 90 imply that the etch times required to form the various openings are different. A major problem with forming the openings is that completing the contact etch to the deeper silicide layers 80 may cause the shallower contact etch (i.e. the etch to silicide layer 90) to continue through silicide layer 90 removing a significant portion of the silicide layer 90. This problem is often addressed by reducing the etch times for forming the deeper openings 110. However reducing the etch time for the deeper openings may lead to under-etched openings resulting in an increased contact resistance.

Topology variations across the wafer also require that the contact etch process contain about a 50% over-etch to ensure that all the openings across the semiconductor wafer are properly formed. This large over-etch results in large contact resistance variations across the semiconductor wafer that make it more difficult to form precision integrated circuits. In addition to the above described MOS transistor other devices such as bipolar junction transistors (BJT) and metal-insulator-metal (MIM) capacitors are also susceptible to the above described contact etch problems. There is therefore a need for a method of forming integrated circuits that reduces and/or eliminates the contact etch formation problems. The instant invention addresses this need.

SUMMARY OF THE INVENTION

The instant invention is a method for forming electrical contacts to electronic devices formed as part of an integrated circuit. A conductive layer is formed on electronic device such as a MOS transistor, capacitor, or bipolar junction transistor. An optional first dielectric layer is formed over the conductive layer and a carbon containing dielectric layer formed over the optional dielectric layer if present. A PMD dielectric layer is formed over the carbon containing dielectric layer and openings are formed in the PMD layer. The openings are formed over the conductive layer, the optional dielectric layer, and the carbon containing dielectric layer. The exposed regions of the carbon containing dielectric layer and the optional dielectric layer (if present) are removed to expose the underlying conductive layer. A conductive material is then used to fill the opening and electrically contact the conductive layer formed on the electronic device.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which:

FIG. 2(a)–FIG. 2(d) are cross-sectional diagrams showing an embodiment of the instant invention.

FIG. 3(a)–FIG. 3(c) are cross-sectional diagrams showing an embodiment of the instant invention.

FIG. 4(a)–FIG. 4(c) are cross-sectional diagrams showing an embodiment of the instant invention.

DETAILED DESCRIPTION OF THE INVENTION

Figure 2A:
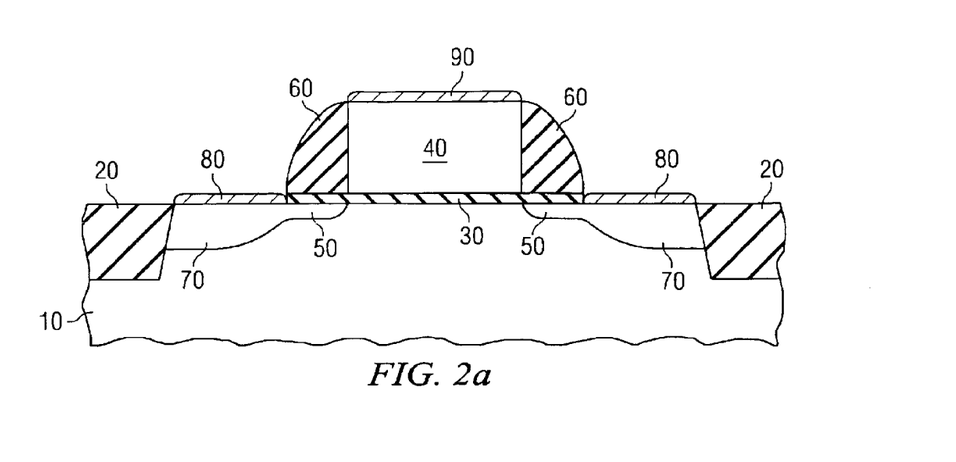

Shown in FIG. 2(a) to FIG. 2(d) are cross-sectional diagrams of a first embodiment of the instant invention. Illustrated in FIG. 2(a) is a MOS transistor formed using known integrated circuit manufacturing methods. As described above isolation regions 20 are formed in a semiconductor 10. A transistor gate stack comprising a gate dielectric layer 30 and a gate electrode 40 is formed on the surface of the semiconductor 10. The gate electrode usually comprises a conductive material such as doped polycrystalline silicon and various metals and silicides. Typical thicknesses for the transistor gate stack are between 800A and 5000A. Following the formation of the transistor gate stack a number of self-aligned implants are performed. These self-aligned implants include drain/source extension implant and pocket implants. The self-aligned implants that are aligned to the transistor gate stack will result in the formation of the doped regions 50 in the semiconductor 10. Sidewall structures 60 are formed adjacent to the gate electrode 40 using standard processing technology. The sidewall structures 60 typically comprise dielectric material such as silicon oxide, silicon nitride, or any other suitable dielectric material. Following the formation of the sidewall structures 60, the transistor source and drain regions 70 are formed by implanting suitable dopants into the semiconductor 10. Following the formation of the source and drain regions 70, metal silicide layers 80 and 90 and formed on the source and drain regions 70 and the gate electrode 40 respectively.

Figure 2B:
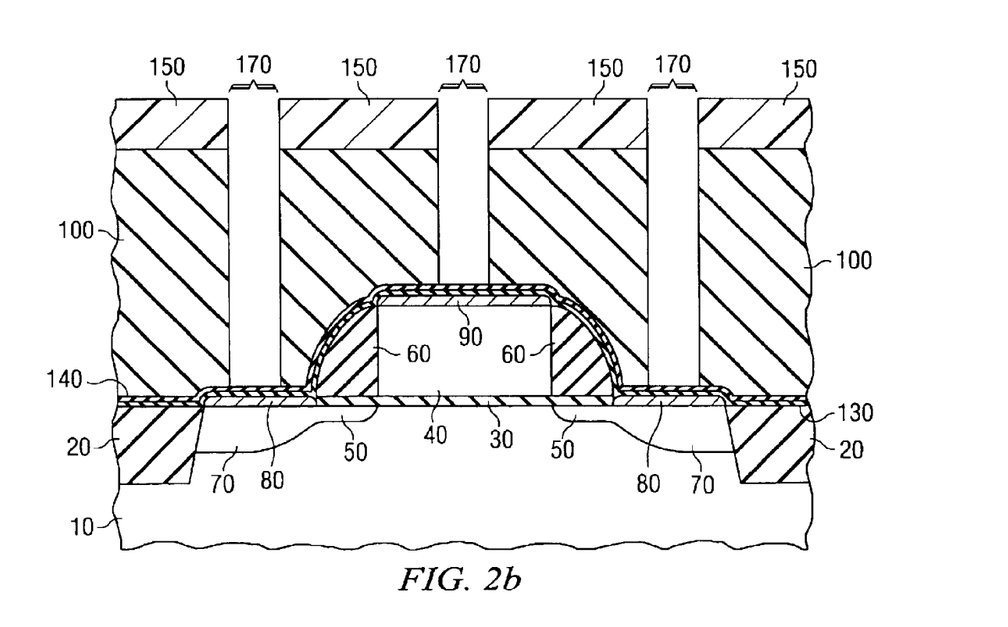

A first dielectric layer comprising silicon oxide 130 is formed over the MOS transistor structure of FIG. 2(a) as shown in FIG. 2(b). The first dielectric layer 130 is optional and is included to prevent the interaction of the gases used to form or etch subsequent layers with the underlying silicide layers 80 and 90. A second dielectric layer 140 is formed on the first dielectric layer 130 as shown in FIG. 2(b). In an embodiment that does not comprise the optional first dielectric layer 130, the second dielectric layer will be formed adjacent to the silicide layers 80 and 90. In an embodiment of the instant invention the second dielectric layer 140 comprises silicon carbide (SiC) in various crystalline and non-crystalline forms such as amorphous hydrogenated silicon carbide. The SiC layer can be formed using a plasma enhanced chemical vapor deposition (PECVD) method although any deposition process may be employed in accordance with the invention. The preferred SiC deposition process would use trimethylsilane as the silicon and carbon source, and a carrier gas of helium, wherein argon, for example, may also be used in place of helium. Examples of other possible source gasses include tetraethylsilane, and silane/methane. It has been found that when depositing with helium, the deposition rates are much reduced, and hence, the thickness of thin layers is more controllable. Even more importantly, the films tend to be more dense, and have lower hydrogen content, which significantly increases the film hardness and its resistance to chemical attack. This then reduces the etchability of this material, and improves etch selectivity of silicon oxide to SiC. In other embodiments the second dielectric layer 140 can comprise silicon oxycarbide, silicon carbonitride, silicon oxycarbonitride and boron carbide.

Figure 2C:
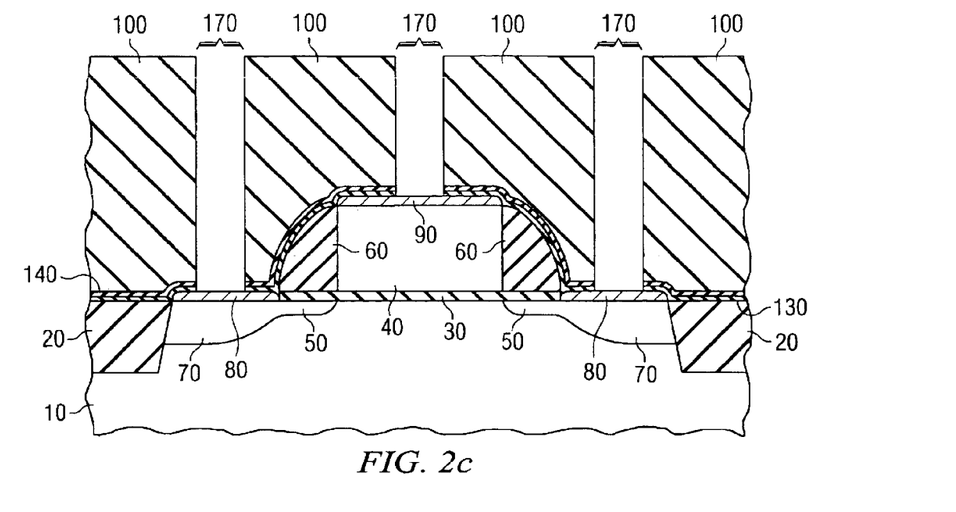
Figure 2D:
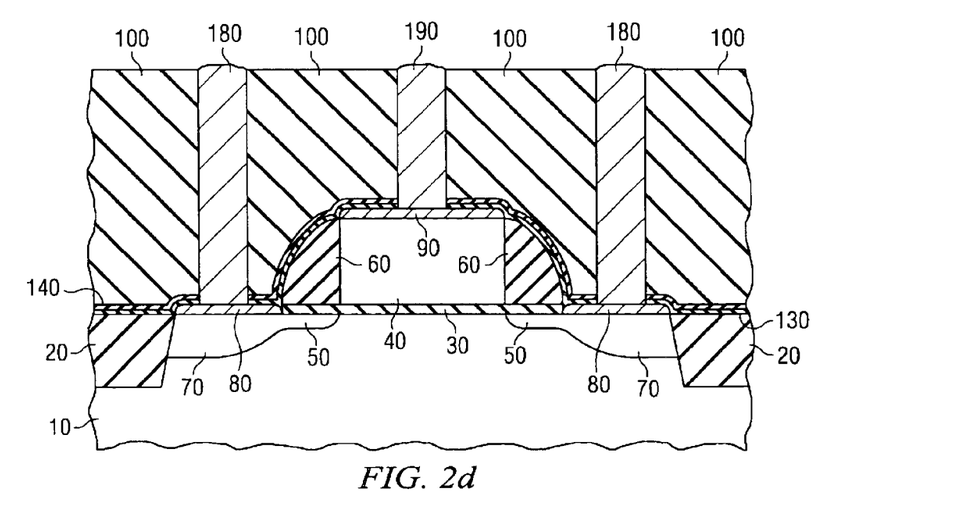

Following the formation of the second dielectric layer 140 a PMD layer 100 is formed over the second dielectric layer 140 and the MOS transistor structure is as shown in FIG. 2(b). A patterned photoresist layer 150 is formed on the PMD layer 100 that serves as an etch mask during the etching of the PMD layer 100 to form the openings 170. The etch process used to etch the PMD layer 100 is highly selective with an etch rate selectivity of at least 8 to 1 for The PMD dielectric 100 and the second dielectric layer 140 respectively. This high selectivity allows the openings above the source and drain regions 70 to be formed without completely removing the exposed region of the second dielectric layer 140 that lies above the gate electrode 40. Following the formation of the openings 170 the regions of the second dielectric layer 140 exposed in the openings 170 are removed using an etch process. The patterned photoresist layer 150 need not be removed before etching the exposed regions of the second dielectric layer 140. In other embodiments however it might be advantageous to remove the patterned photoresist layer 150 using standard semiconductor processing techniques before etching the second dielectric layer 140. In an embodiment where the second dielectric layer 140 comprises SiC, the SiC layer can be etched using a reactive ion etching (RIE) process that comprises chlorine or fluorine. In a further embodiment of the SiC RIE process, 1 to 10 percent of oxygen can be added to the RIE etch that comprises chlorine or fluorine. The RIE etch process will remove the exposed regions of the second dielectric layer 140 without significantly attacking the underlying layer. In the embodiment of the instant invention that comprises the optional first dielectric layer 130 a second etch process is required to remove the exposed regions of the first dielectric layer 130 in the openings 170. The exposed regions of the first dielectric layer 130 can be removed using RIE or wet chemical etch processes. Following the removal of the exposed regions of the first and second dielectric regions 130 and 140 the structure is as shown in FIG. 2(c). If the patterned photoresist 150 is still present it is removed and conducting material can now be used to form electrical contacts to the MOS transistor gate electrode 40 and the source and drain regions 70. This is illustrated in FIG. 2(d) where conductive material such as a metal is used to form electrical contacts 180 to the MOS transistor source and drain regions 70 as well as an electrical contact 190 to the MOS transistor gate electrode 40. The first embodiment of the instant invention should not be confined to MOS transistor structure shown in FIGS. 2(a) to 2(e). The first embodiment of the instant invention is applicable to any MOS transistor structure where the upper surface of the gate electrode is positioned above the upper surface of the source and drain regions.

Figure 3A:
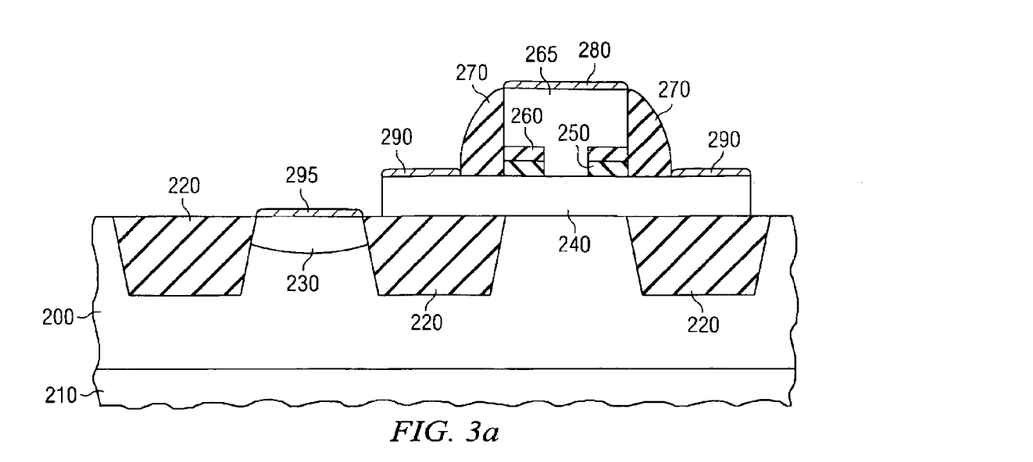
Figure 3B:
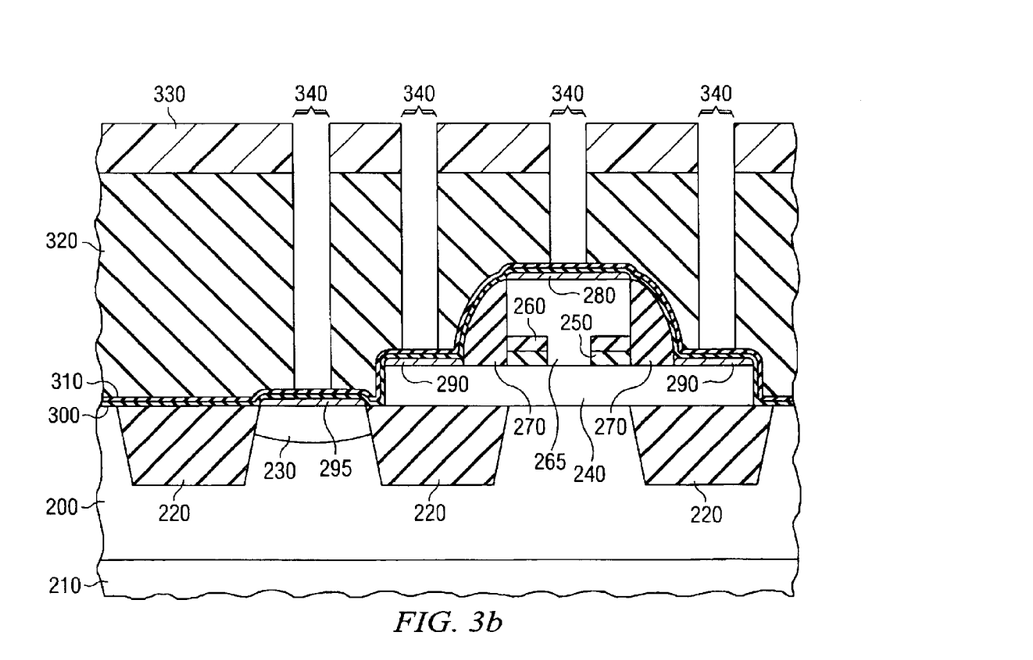
Figure 3C:
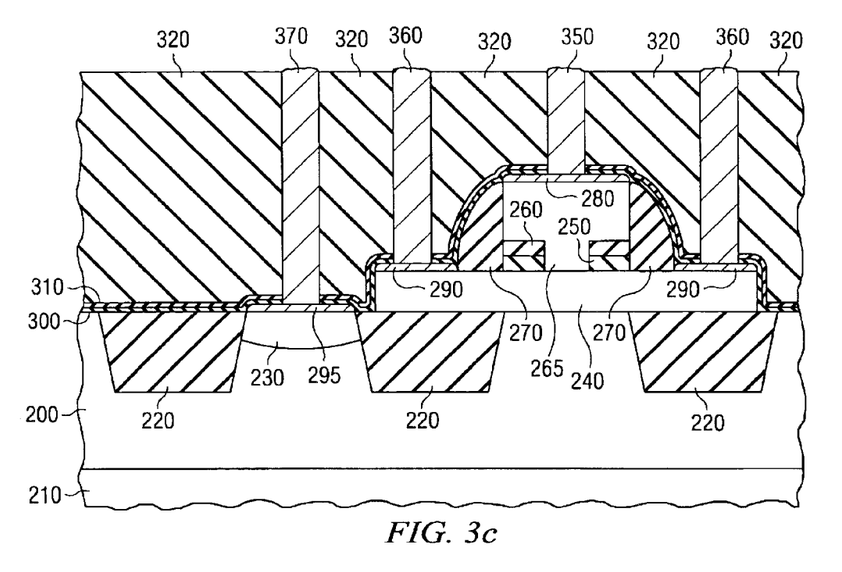

Shown in FIG. 3(a) to FIG. 3(c) are cross-sectional diagrams of a second embodiment of the instant invention. Illustrated in FIG. 3(a) is a bipolar junction transistor (BJT) formed using known integrated circuit manufacturing methods. A highly doped buried layer 210 is formed in a semiconductor of a first conductivity type 200. Isolation regions 220 are formed in the semiconductor 200. A first silicon layer of a second conductivity type 240 is formed on the surface of the semiconductor 200 and will act as the base of the BJT. A highly doped region 230 is formed in the semiconductor 200 to provide electrical contact to the collector region of the BJT. Silicon oxide layers and silicon nitride layers are deposited and etched to form the silicon oxide 250 and silicon nitride 260 structures. A second silicon layer 265 of a first conductivity type is formed over the first silicon layer 240 and the silicon nitride structures 260 and will function as the emitter region of the BJT. In the BJT structure shown in FIG. 3(a) the first conductivity type can be n-type and the second conductivity p-type or vice versa. Sidewall structures 270 are formed adjacent to the second silicon layer 265 and the silicon oxide 250 and silicon nitride 260 structures as shown in FIG. 3(a). Conductive layers 280, 290, and 295 are then formed on the regions of the first silicon layer 240, the second silicon layer 265 and the highly doped implanted region 230 to provide low contact resistance contacts to the base, emitter, and collector regions of the BJT respectively. These conductive layers 280, 290, and 295 can comprise a metal silicide or any other suitable conductive material.

A first dielectric layer comprising silicon oxide 300 is formed over the BJT structure of FIG. 3(a) as shown in FIG. 3(b). The first dielectric layer 300 is optional and is included to prevent the interaction of the gases used to form or etch subsequent layers with the underlying layers. A second dielectric layer 310 is formed on the first dielectric layer 300 as shown in FIG. 3(b). In the embodiments that do not comprise the optional first dielectric layer 300, the second dielectric layer will be formed adjacent to the conductive layers 280, 290, and 295. In an embodiment of the instant invention the second dielectric layer 310 comprises silicon carbide (SiC) in various crystalline and non-crystalline forms such as amorphous hydrogenated silicon carbide. The SiC layer can be formed using a plasma enhanced chemical vapor deposition (PECVD) method although any deposition process may be employed in accordance with the invention. The preferred SiC deposition process would use trimethylsilane as the silicon and carbon source, and a carrier gas of helium, wherein argon, for example, may also be used in place of helium. Examples of other possible source gasses include tetraethylsilane, and silane/methane. It has been found that when depositing with helium, the deposition rates are much reduced, and hence, the thickness of thin layers is better controllable. Even more importantly, the films tend to be denser, and have lower hydrogen content, which significantly increases the film hardness and its resistance to chemical attack. This then reduces the etchability of this material, and improves etch selectivity of silicon oxide to SiC. In other embodiments the second dielectric layer 310 can comprise silicon oxycarbide, silicon carbonitride, silicon oxycarbonitride and boron carbide.

Following the formation of the second dielectric layer 310 a PMD layer 320 is formed over the second dielectric layer 310 and the BJT structure as shown in FIG. 3(b). A patterned photoresist layer 330 is formed on the PMD layer 320 that serves as an etch mask during the etching of the PMD layer 320 to form the openings 340. The etch process used to etch the PMD layer 320 is highly selective with an etch rate selectivity of at least 8 to 1 for the PMD dielectric 320 and the second dielectric layer 310 respectively. Following the formation of the openings 340 the regions of the second dielectric layer 310 exposed in the openings 340 are removed using an etch process. The patterned photoresist layer 330 need not be removed before etching the exposed regions of the second dielectric layer 310. In other embodiments however it might be advantageous to remove the patterned photoresist layer 330 using standard semiconductor processing techniques before etching the second dielectric layer 310. In an embodiment where the second dielectric layer 310 comprises SiC, the SiC layer can be etched using a reactive ion etching (RIE) process that comprises chlorine or fluorine. In a further embodiment of the SiC RIE etch process, 1 to 10 percent of oxygen can be added to the RIE etch that comprises chorine or fluorine. This etch process will remove the exposed regions of the second dielectric layer 310 without significantly attacking the underlying layers. In the embodiment of the instant invention that comprises the optional first dielectric layer 300, a second etch process is required to remove the exposed regions of the first dielectric layer 300 in the openings 340. The exposed regions of the first dielectric layer 300 can be removed using RIE or wet chemical etch processes. Following the removal of the exposed regions of the first and second dielectric regions 300 and 310, the remaining patterned photoresist layer 330 is removed if present and conducting material is used to form electrical contacts to the BJT emitter, base and collector regions. This is illustrated in FIG. 3(c) where conductive material such as a metal is used to form electrical contacts 360 to the base of the BJT as well as electrical contacts 350 and 370 to the emitter and collector regions of the BJT respectively. The second embodiment of the instant invention should not be confined to BJT structure shown in FIGS. 3(a) to 3(c). The second embodiment of the instant invention is applicable to any BJT structure where the upper surface of the emitter region is above the upper surface of the base regions or above the upper surface of the collector region.

Figure 4A:
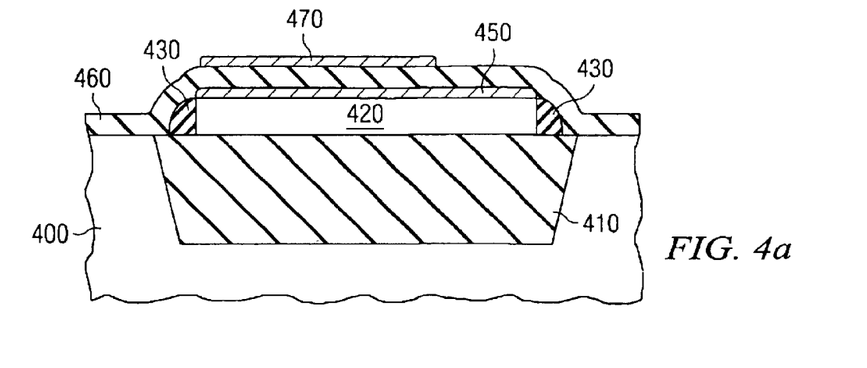
Figure 4B:
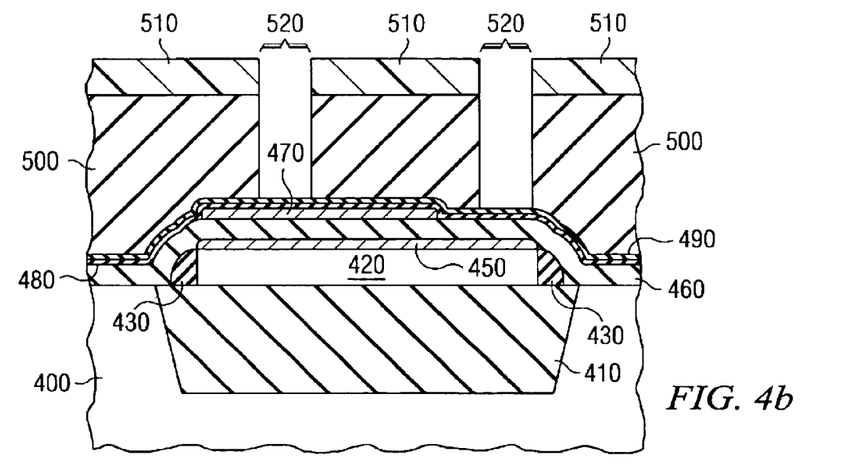
Figure 4C:
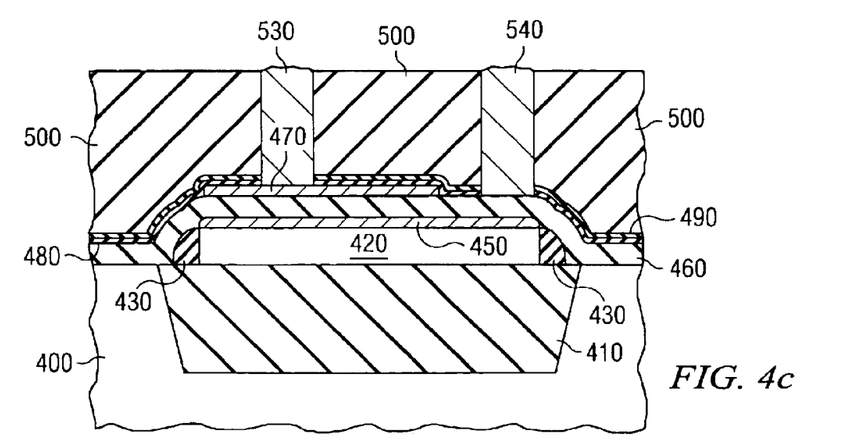

Shown in FIG. 4(a) to FIG. 4(c) are cross-sectional diagrams of a third embodiment of the instant invention. Illustrated in FIG. 4(a) is metal-oxide-metal capacitor formed using known integrated circuit manufacturing methods. An isolation region 410 is formed in a semiconductor. A polycrystalline silicon layer 420 is formed on the isolation structure 410 and sidewall structures 430 are formed adjacent to the polysilicon layer 410. A conductive layer 450 is formed on the polycrystalline layer 420 that will serve as the first plate of the capacitor. A dielectric layer 460 is formed over the conductive layer 450 as shown in FIG. 4(a). The dielectric layer 460 will function as the capacitor dielectric. A second conductive layer 470 is formed on the dielectric layer as shown in FIG. 4(a) and will function as the second plate of the capacitor. It should be noted that the second conductive layer 470 does extend over the entire length of the polysilicon layer 420.

A first dielectric layer comprising silicon oxide 480 is formed over the metal-oxide-metal capacitor structure of FIG. 4(a) as shown in FIG. 4(b). The first dielectric layer 480 is optional and is included to prevent the interaction of the gases used to form or etch subsequent layers with the underlying layers. A second dielectric layer 490 is formed on the first dielectric layer 480 as shown in FIG. 4(b). In the embodiments that do not comprise the optional first dielectric layer 480, the second dielectric layer 490 will be formed adjacent to the conductive layer 470. In an embodiment of the instant invention the second dielectric layer 490 comprises silicon carbide (SiC) in various crystalline and non-crystalline forms such as amorphous hydrogenated silicon carbide. The SiC layer can be formed using a plasma enhanced chemical vapor deposition (PECVD) method although any deposition process may be employed in accordance with the invention. The preferred SiC deposition process would use trimethylsilane as the silicon and carbon source, and a carrier gas of helium, wherein argon, for example, may also be used in place of helium. Examples of other possible source gasses include tetraethylsilane, and silane/methane. It has been found that when depositing with helium, the deposition rates are much reduced, and hence, the thickness of thin layers is better controllable. Even more importantly, the films tend to be denser, and have lower hydrogen content, which significantly increases the film hardness and its resistance to chemical attack. This then reduces the etchability of this material, and improves etch selectivity of silicon oxide to SiC. In other embodiments the second dielectric layer 490 can comprise silicon oxycarbide, silicon carbonitride, silicon oxycarbonitride and boron carbide.

Following the formation of the second dielectric layer 490, a PMD layer 500 is formed over the second dielectric layer 490 and the metal-oxide-metal capacitor structure as shown in FIG. 4(b). A patterned photoresist layer 510 is formed on the PMD layer 500 that serves as an etch mask during the etching of the PMD layer 500 to form the openings 520. The etch process used to etch the PMD layer 500 is highly selective with an etch rate selectivity of at least 8 to 1 for The PMD dielectric 500 and the second dielectric layer 490 respectively. Following the formation of the openings 520, the regions of the second dielectric layer 490 exposed in the openings 520 are removed using an etch process. The patterned photoresist layer 510 need not be removed before etching the exposed regions of the second dielectric layer 490. In other embodiments however it might be advantageous to remove the patterned photoresist layer 510 using standard semiconductor processing techniques before etching the second dielectric layer 490. In an embodiment where the second dielectric layer 490 comprises SiC, the SiC layer can be etched using a reactive ion etching (RIE) process that comprises chlorine or fluorine. In a further embodiment of the SiC RIE etch process, 1 to 10 percent of oxygen can be added to the RIE etch comprising chlorine or fluorine. This etch process will remove the exposed regions of the second dielectric layer 490 without significantly attacking the underlying layers. In the embodiment of the instant invention that comprises the optional first dielectric layer 480, a second etch process is required to remove the exposed regions of the first dielectric layer 480 in the openings 520. The exposed regions of the first dielectric layer 480 can be removed using RIE or wet chemical etch processes. Following the removal of the exposed regions of the first and second dielectric regions 480 and 490, the patterned photoresist layer 510 is removed if still present, and conducting material is used to form electrical contacts to the metal regions of the metal-oxide-metal capacitor. This is illustrated in FIG. 4(c) where conductive material such as a metal is used to form electrical contacts 530 and 540. The third embodiment of the instant invention should not be confined to metal-oxide-metal capacitor structure shown in FIGS. 4(a) to 4(c). The third embodiment of the instant invention is applicable to any capacitor structure where electrical contacts are formed to the metal plates of the capacitor.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming an integrated circuit capacitor, comprising:

forming a first conductive layer over a semiconductor;

forming a first dielectric layer over said first conductive layer;

forming a second patterned conductive layer over said first dielectric layer and said first conductive layer;

forming a second dielectric layer over said second patterned conductive layer;

forming a third dielectric layer comprising carbon over said second patterned conductive layer;

forming a PMD dielectric layer over said third dielectric layer and said second patterned conductive layer;

forming at least one opening in said PMD dielectric layer over said second patterned conductive layer thereby exposing a region of said third dielectric layer;

removing said exposed region of said third dielectric layer thereby exposing a region of said second dielectric layer;

removing said exposed region of said second dielectric layer; and forming a third conductive region in said opening of said PMD layer wherein said first conductive region contacts said second patterned conductive layer.

2. The method of claim 1 wherein said third dielectric layer is formed from a material selected from the group consisting of silicon carbide, silicon oxycarbide, silicon carbonitride, silicon oxycarbonitride and boron carbide.

3. The method of claim 2 wherein said removing said exposed region of said third dielectric layer comprises using a RIE etch comprising chlorine.

* * * * *